(12) United States Patent
Wang et al.

(10) Patent No.: US 9,591,752 B2
(45) Date of Patent: Mar. 7, 2017

(54) ARTICLES WITH CONDUCTIVE MICRO-WIRE PATTERN

(71) Applicant: Eastman Kodak Company, Rochester, NY (US)

(72) Inventors: Yongcai Wang, Rochester, NY (US); John Andrew Lebens, Rush, NY (US); Mitchell Lawrence Wright, Rochester, NY (US); Julie A. Cummings, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 15 days.

(21) Appl. No.: 14/836,052

(22) Filed: Aug. 26, 2015

(65) Prior Publication Data

US 2015/0366057 A1 Dec. 17, 2015

Related U.S. Application Data

(62) Division of application No. 14/094,841, filed on Dec. 3, 2013, now Pat. No. 9,155,201.

(51) Int. Cl.
*H05K 1/00* (2006.01)
*H05K 1/09* (2006.01)
(Continued)

(52) U.S. Cl.
CPC ............ *H05K 1/09* (2013.01); *G03F 7/0002* (2013.01); *G03F 7/0035* (2013.01); *H05K 1/028* (2013.01);
(Continued)

(58) Field of Classification Search
CPC .. H05K 1/09; B29D 11/00; G03F 9/00; H01L 31/02; H01L 31/18; H01L 31/04; H03K 17/96
(Continued)

(56) References Cited

U.S. PATENT DOCUMENTS 6,667,360 B1 12/2003 Ng et al.
6,932,934 B2 8/2005 Choi et al.
(Continued)

FOREIGN PATENT DOCUMENTS

WO 2010/109465 9/2010

*Primary Examiner* — Xiaoliang Chen
(74) *Attorney, Agent, or Firm* — J. Lanny Tucker

(57) ABSTRACT

Conductive articles and devices have conductive micro-wires formed by curing a photocurable layer on a transparent flexible substrate that has a distortion temperature of less than 150° C. The photocurable layer has a viscosity <5,000 Pascal-seconds at the temperature micro-channels formation and the micro-channels having an average width of less than or equal to 4 μm and an average depth to average width ratio that is greater than or equal to 1. The photocurable layer is exposed to curing ultraviolet radiation to form a pattern of photocured micro-channels and a conductive composition comprising metal nano-particles is formed in the photocured micro-channels. The conductive composition is cured in the pattern of photocured micro-channels to provide a pattern of conductive micro-wires in the pattern of photocured micro-channels on the transparent flexible substrate. Each of at least 50% of the conductive micro-wires has a sheet resistance of less than 0.025 ohms/sq.

9 Claims, 15 Drawing Sheets

(51) Int. Cl.
*H05K 3/00* (2006.01)
*H05K 1/02* (2006.01)
*H05K 3/04* (2006.01)
*H05K 3/22* (2006.01)
*G03F 7/00* (2006.01)
*H05K 1/03* (2006.01)

(52) U.S. Cl.
CPC ......... *H05K 1/0274* (2013.01); *H05K 1/0296* (2013.01); *H05K 1/0313* (2013.01); *H05K 3/0023* (2013.01); *H05K 3/04* (2013.01); *H05K 3/22* (2013.01); *H05K 2201/0108* (2013.01); *H05K 2201/032* (2013.01)

(58) Field of Classification Search
USPC ..... 174/253, 257; 430/5, 322, 394; 136/251, 136/256; 216/24
See application file for complete search history.

(56) References Cited

U.S. PATENT DOCUMENTS

| | | | |
|---|---|---|---|
| 7,922,939 B2 | 4/2011 | Lewis et al. | |
| 7,931,941 B1 | 4/2011 | Mastropietro et al. | |
| 7,968,011 B2 | 6/2011 | Overbeek et al. | |
| 8,076,386 B2 | 12/2011 | Xu et al. | |
| 8,179,381 B2 | 5/2012 | Frey et al. | |
| 8,227,022 B2 | 7/2012 | Magdassi et al. | |
| 2003/0135998 A1 | 7/2003 | Walz et al. | |
| 2006/0278853 A1 | 12/2006 | Yang | |
| 2007/0072093 A1* | 3/2007 | Sawada | G03F 1/14 430/5 |
| 2009/0045163 A1* | 2/2009 | Lambertini | B82Y 10/00 216/24 |
| 2010/0328248 A1 | 12/2010 | Mozdzyn | |
| 2011/0069374 A1* | 3/2011 | Yamazaki | G02F 1/167 359/296 |
| 2012/0327021 A1 | 12/2012 | Ryu et al. | |
| 2013/0020115 A1* | 1/2013 | Metaye | C25F 3/12 174/257 |
| 2013/0025675 A1* | 1/2013 | Lee | H01L 31/02168 136/256 |
| 2013/0162328 A1* | 6/2013 | Lee | G06F 3/044 327/517 |
| 2014/0332061 A1* | 11/2014 | Lee | H01L 31/03928 136/251 |
| 2015/0060113 A1 | 3/2015 | Wang et al. | |
| 2015/0064426 A1 | 3/2015 | Wang et al. | |

* cited by examiner

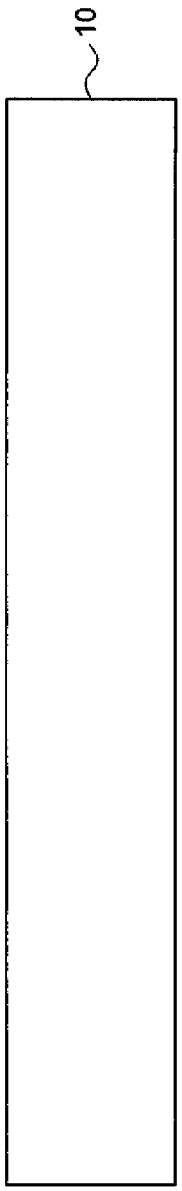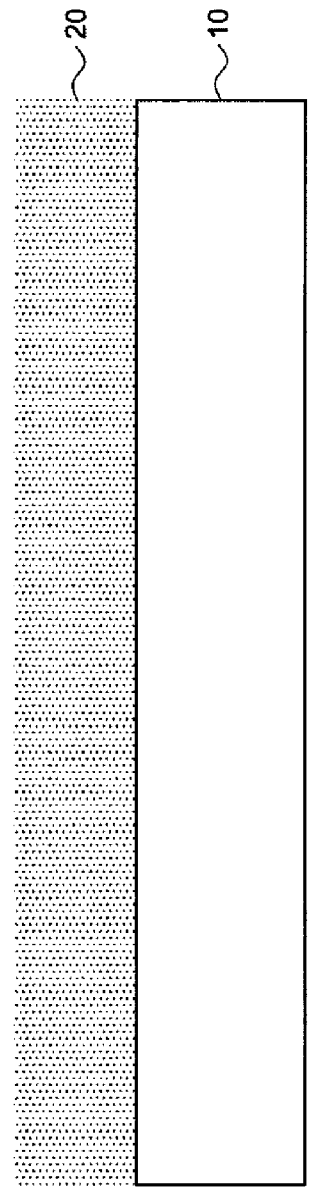

43 °C

ARTICLES WITH CONDUCTIVE MICRO-WIRE PATTERN

CROSS-REFERENCE TO RELATED APPLICATIONS

This is a divisional of application Ser. No. 14/094,841, filed Dec. 3, 2013, which is incorporated herein by reference in its entirety.

Reference is made to copending and commonly assigned U.S. Ser. Nos. 14/017,638 and 14/017,707 (both filed Sep. 4, 2013 by Wang, Lebens, and Wright, and Wang, Lebens, and DiCillo, respectively).

FIELD OF THE INVENTION

This invention relates to a method for forming a micro-wire pattern on a transparent flexible substrate and conductive articles prepared using the method. More specifically, this invention relates to a method for forming transparent flexible conductive articles (films) that comprise fine line patterns of conductive micro-wires using photo-imprinting technology.

BACKGROUND OF THE INVENTION

Photo-imprinting techniques have been proposed as methods for forming micrometer and sub-micrometer size features on a substrate. In such techniques, patterns are formed by pressing an imprinting stamp or mold that has a pre-formed pattern on its surface, against a substrate having a layer (receiving layer) that can be imprinted. Both thermoplastic resins and photocurable resins can be used as the receiving layer. A thermoplastic resin can be heated above its softening point before imprinting and subsequently cooling to lower temperatures that cause the pattern to be fixed on the receiver layer surface before the imprinting stamp or mold is released. With photocurable resins, the imprinting stamp or mold is pressed against the receiver layer surface during irradiation (photo-imprint lithography). The resulting pattern can be fixed by photocuring. Depending on the nature of the photocurable resin, an additional thermal curing can be used before the imprinting stamp or mold is released. Such imprinting techniques are also known in the art as embossing or impressing.

A variety of known materials are useful for photo-imprint lithography. For example, photocurable compositions comprising a highly branched, multifunctional epoxy bisphenol A-novolac resins, such as Epon SU-8 from Momentive Specialty Chemicals Inc. have been described in the literature as high-aspect resists for thick-film applications. The photocurable compositions are generally formulated as solutions including an acid generating compound such as a di- or triaryl-substituted sulfonium or iodonium complex salt. The photocurable compositions can be applied to a substrate and dried to provide a dry coating thickness up to 100 µm. The dried coating can be photoimaged by exposure to UV light through a patterned photomask using contact, proximity, or projection exposures and then developed to form a high-resolution, negative-tone relief image of the photomask. Other performance benefits with the use of Epon SU-8 are its excellent thermal, chemical, and etching resistances when it is cured properly.

Recently, transparent electrodes including very fine patterns of conductive micro-wires have been proposed for various uses including touch screen displays. For example, capacitive touch screen displays having mesh electrodes including very fine line patterns of conductive elements, such as metal wires or conductive traces, are taught in U.S. Patent Application Publication 2010/0328248 (Mozdzyn) and U.S. Pat. No. 8,179,381 (Frey et al.). As disclosed in U.S. Pat. No. 8,179,381, fine conductor patterns are made by one of several processes, including laser-cured masking, inkjet printing, gravure printing, micro-replication, and micro-contact printing. The transparent micro-wire electrodes can include micro-wires that are 0.5 µm to 4 µm wide and exhibit a transparency in the display of 86% to 96%.

Fine patterns of conductive micro-wires can also be formed by inkjet printing conductive compositions ("inks") onto a substrate followed by sintering the conductive compositions at a proper temperature, for example as described in U.S. Pat. No. 8,227,022 (Magdassi et al.) wherein it is disclosed to generate conductive patterns using aqueous-based silver nano-particle inks with multi-pass inkjet printing (5 passes or more) and sintering the printed patterns at temperatures of equal to greater than 150° C.

Moreover, U.S. Pat. No. 7,922,939 (Lewis et al.) discloses a silver nano-particle containing conductive composition having a silver concentration greater than 50% by weight. These conductive compositions can be considered as a high-viscous gel and have an elastic modulus value greater than the loss modulus value. However, the electrical conductivity generated by such conductive compositions is limited after annealing at high temperatures.

U.S. Pat. No. 7,931,941 (Mastropietro et al.) discloses a method of making a silver nano-particle dispersion using a carboxylic acid stabilizer resulting conductive films prepared at lower sintering temperatures. However, such dispersions cannot be readily formulated into conductive compositions.

WO2010/109465 (Magdassi et al.) discloses incorporating halide ions as a sintering agent into silver-containing dispersions or imprintable receivers to improve conductivity of the resulting patterns.

The art describes various forms of non-aqueous based silver nano-particle dispersions and some are commercially available. For environmental and safety reasons, it is highly desirable to have aqueous-based silver nano-particle dispersions. For performance reasons, it is highly desirable that these aqueous silver nano-particle dispersions are colloidally stable, can be prepared at high concentrations with low viscosities, are water reducible with excellent re-dissolution behaviors, and have excellent electrical conductivity after sintering.

Conductive micro-wires can be formed in micro-channels that have been embossed or imprinted into a photocurable composition on a substrate as described above. A photocurable composition can be applied to a suitable substrate. A pattern of micro-channels is embossed (impressed) onto the photocurable composition layer by a master (or mold) having a reverse pattern of ridges formed on its surface. The impressed photocurable composition is then cured by light before the master (mold) is released. An additional heat curing step can be used to further cure the composition. A conductive composition can be coated over the substrate, flowing into the formed micro-channels, and it is desired to remove excess conductive composition between micro-channels for example by mechanical buffing, patterned chemical electrolysis, or patterned chemical corrosion. The conductive composition remaining in the micro-channels can be cured, for example by heating.

The challenge for using such a method is to completely fill the micro-channels with the conductive composition without retaining residual conductive composition between the micro-channels. Yet, if the micro-channels are not completely filled with conductive composition, the conductivity of the micro-wires is significantly reduced and if the residual conductive composition is not removed, transparency of substrate and resulting conductive articles are impaired.

Besides the high transparency and conductivity that are desired, it is also desirable that the conductive micro-wires have good adhesion to the micro-channels on the substrate and are protected from scratches and other potential physical damage. Good micro-wire adhesion is required for flexible displays that can potentially experience a great deal of bending or flexing during device manufacture. Conversely, weak micro-wire adhesion can lead to the micro-wires popping out of the micro-channels and breaking.

Improvement in providing conductive patterns is described in copending and commonly assigned U.S. Ser. Nos. 14/017,638 and 14/017,707 (both noted above).

However, further improvements in this technology are needed whereby very narrow micro-wires of high aspect ratios can be formed to enhance the optical properties of the transparent conductive electrode without sacrificing its electrical performance, for example, the electrical conductivity. The overall challenges are how to form such narrow micro-channels of high aspect ratios and how to fill these micro-channels efficiently with conductive materials to form micro-wires that have low sheet resistance but without retaining residual composition between the micro-wires. With prior art technology and process, it becomes even more difficult to form such narrow micro-wires of high aspect ratios on flexible substrates that are more prone to heat distortion at relatively low to moderate temperatures, for example less than 150° C. If a high mechanical force is used to imprint micro-channels on such substrate, the heat distortion temperature will be even lower.

Thus, there is a need to develop technology for forming micro-channels on flexible substrates at relatively lower temperatures, for example less than 100° C. and at lower pressures. It is also desirable to develop a conductive material and a filling process to fill the micro-channels efficiently with the conductive material that will have a low sheet resistance value, and without retaining residual material between the micro-channels.

SUMMARY OF THE INVENTION

The present invention provides an improvement in the art for providing conductive micro-wires for use in various articles and devices. Thus, the present invention provides a method for making a micro-wire pattern in an article, the method comprising:

providing a photocurable layer on a transparent flexible substrate that has a distortion temperature of less than 150° C., forming a pattern of micro-channels within the photocurable layer that has a viscosity of less than 5,000 Pascal-seconds at the temperature at which the micro-channels are formed, the micro-channels having an average width of less than or equal to 4 μM and an average depth to average width ratio that is greater than or equal to 1, exposing the photocurable layer to curing ultraviolet radiation to form a pattern of photocured micro-channels within a photocured layer on the transparent flexible substrate, the photocured micro-channels having an average width of less than or equal to 4 μm and an average depth to average width ratio that is greater than or equal to 1, applying a conductive composition comprising metal nano-particles to the photocured micro-channels, removing any excess conductive composition outside the photocured micro-channels while leaving conductive composition within the pattern of photocured micro-channels, curing the conductive composition in the pattern of photocured micro-channels to provide a pattern of conductive micro-wires in the pattern of photocured micro-channels on the transparent flexible substrate, and optionally, polishing the pattern of conductive micro-wires on the transparent flexible substrate, wherein each of at least 50% of the conductive micro-wires has a sheet resistance of less than 0.025 ohms/sq.

In addition, the present invention provides a conductive article prepared according to any embodiment of the method of this invention, the article comprising a transparent flexible substrate and a pattern of conductive micro-wires disposed thereon, which conductive micro-wires have an average width of less than or equal to 4 μm and an average depth to average width ratio greater than 1, and each of at least 50% of the conductive micro-wires has a sheet resistance of less than 0.025 ohm/sq.

The present invention also provides a device comprising a conductive article of any embodiment of this invention, the conductive article comprising a transparent flexible substrate and a pattern of conductive micro-wires disposed thereon in photocured micro-channels formed by imprinting and curing a photocurable composition that has a viscosity of less than 5,000 Pascal-seconds at the temperature at which the micro-channels are formed, which conductive micro-wires have an average width of less than or equal to 4 μm and an average depth to average width ratio greater than 1, and each of at least 50% of the conductive micro-wires has a sheet resistance of less than 0.025 ohm/sq.

The article of this invention can be incorporated into any suitable device requiring a conductive pattern of micro-wires. For example, they can be used to provide touch panel displays with improved high-frequency response. For example, the present invention provides a device comprising a conductive article, the article comprising a transparent flexible substrate and a pattern of conductive micro-wires disposed thereon in micro-channels formed by imprinting and curing a photocurable composition having a viscosity before curing of less than 5,000 Pascal-seconds at a temperature at which the micro-channels are being formed. In addition, and the photocured micro-channels and resulting conductive micro-wires independently have an average width of less than or equal to 4 μm and each of at least 50% of the micro-wires has a sheet resistance of less than 0.025 ohms/sq.

The micro-wires provided according to the present invention exhibit various improved properties including improved adhesion and scratch resistance because of their unique geometry and size. A significant advantage of the present invention is that the transparent conductive electrodes provided by the present invention exhibit low distortion, good uniformity, and improved optical properties. Another significant advantage is that the polishing can be done prior to curing step to effectively remove any residuals on the surface between micro-wires without reducing the electrical sheet resistance of micro-wires after curing. The micro-wires exhibit low electrical resistivity of less than 10 ohms/sq at a micro-wire width as low as 2 to 4 μm as well as excellent physical durability. To provide the unique micro-wires by the present invention, it was found desirable to form (imprint) the micro-channels in the photocurable composition on the transparent flexible substrate at relatively lower temperatures and viscosity.

BRIEF DESCRIPTION OF THE DRAWINGS

FIGS. 2A-2H are schematic cross-sectional views illustrating an embodiment of the method of the present invention.

DETAILED DESCRIPTION OF THE INVENTION

Definitions

Figure 1:
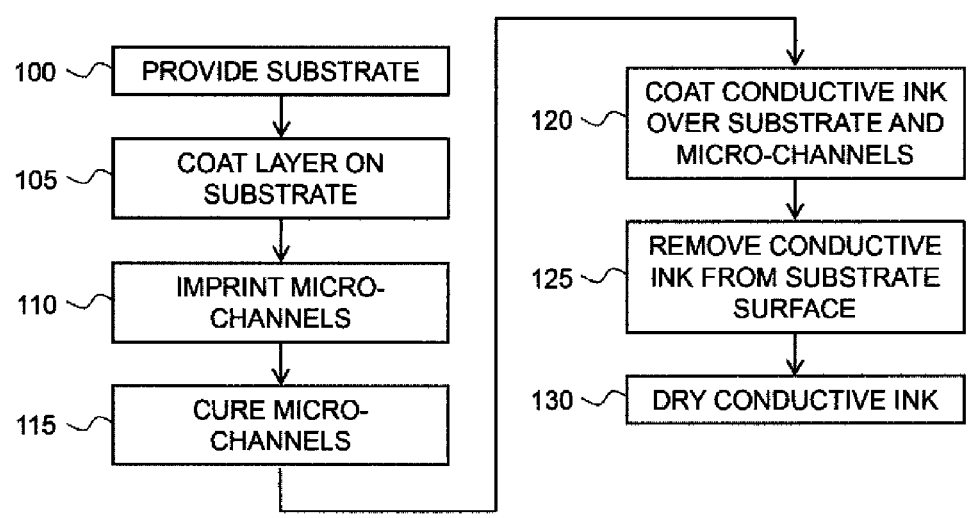
FIG. 1 is a flow diagram that describes one useful embodiment of the present invention.

As used herein to define various components of the photocurable composition, conductive compositions, conductive layers, and formulations, unless otherwise indicated, the singular forms "a," "an," and "the," are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

The term "imprinting" used herein to form the micro-channels in a photocurable composition described herein can also be known as "embossing" or "impressing."

A "micro-channel" is a groove, trench, or channel formed on or in a substrate as described below and generally includes an average depth and average width in micrometers. A micro-channel becomes a photocured micro-channel upon exposure to suitable curing radiation.

A "pattern" of micro-wires is composed of a plurality of micro-wires and the pattern has a predetermined geometry based on the imprinting pattern used to form the micro-channels.

The conductive articles of the present invention generally exhibit a transparency to visible radiation of at least 80% and particular of at least 85% as determined using spectrophotometry and known procedures.

In general, the conductive articles of this invention exhibit a haze value of less than 10% and more typically less than 5%, as determined using spectrophotometry and known procedures.

When used to define average width and average depth of micro-channels or micro-wires prepared by the present invention, "average" can be determined by making at least 5 measurements of the micro-channels or micro-wires at 5 different places in the micro-channel pattern or micro-wire pattern.

"Aspect ratio" is considered herein to be the same as the "average depth to average width ratio" of either the micro-channels, photo-cured micro-channels, or resulting micro-wires, provided according to the present invention.

The sheet resistance (Rs) of a conductive micro-wire is calculated according to the formula:

$$Rs = Rw/l$$

wherein R is the electrical resistance value measured for the micro-wire having an average length of l and an average width of w. In the conductive articles and devices of this invention that are prepared according to the method of this invention, at least 50% of the total formed conductive micro-wires has a sheet resistance of less than 0.025 ohm/sq. While it would be desirable that all of the conductive micro-wires have this property, in reality, less than 100% of the conductive micro-wires will likely have this sheet resistance, but it is desirable to have as high a percentage as possible, and in most embodiments, each of at least 75% or even each of at least 90% of the conductive micro-wires has a sheet resistance of less than 0.025 ohm/sq.

The viscosity of the photocurable layer composition at a temperature of interest can be measured by a creep experiment wherein a shear stress $\sigma$ is applied to the composition at a temperature of interest within a very brief period before time 0 and then maintained constant. The dependence of the strain $\gamma(t)$ on time is measured, and the creep compliance J(t) is calculated by the following equation:

$$J(t) = \gamma(t)/\sigma.$$

Figure 5:
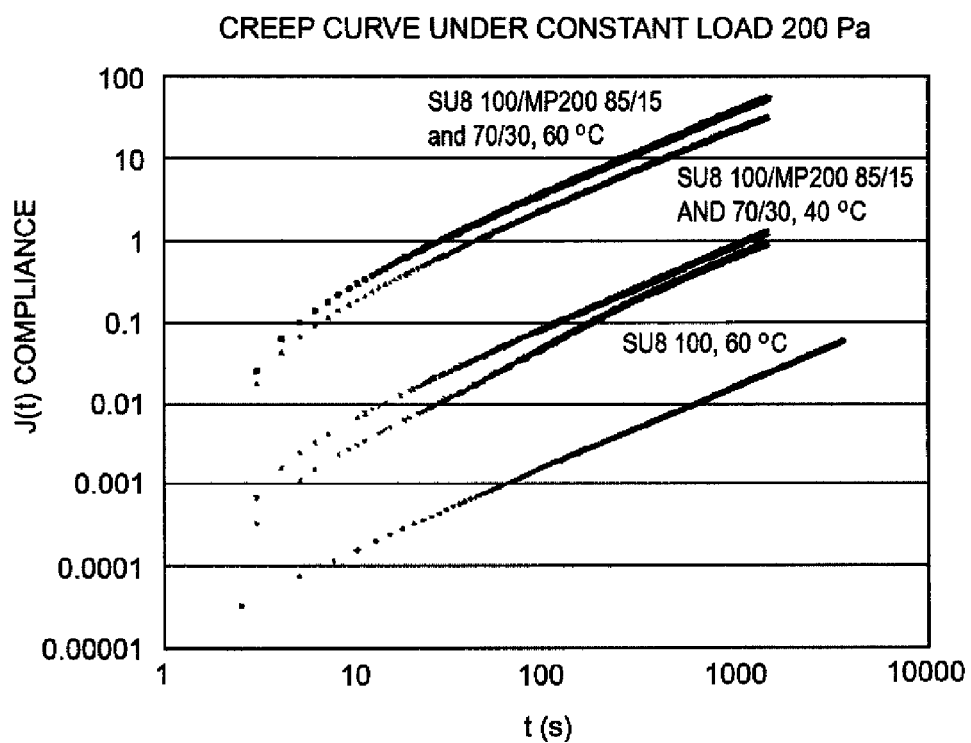
FIG. 5 is a graphical plot of the creep compliance J(t) of photocurable compositions prior to curing as a function of time (t).

FIG. 5 shows examples of results from such measurements on some photocurable layer compositions of interest, wherein Coatosil MP-200 is an epoxysilane oligomer that was obtained from Momentive Performance Materials, and Epon SU-8 is a multifunctional epoxy compound that was obtained from Momentive Performance Materials. FIG. 5 also shows the temperature and the weight ratio of the two materials used in the measurements.

The experimental data can be fitted nicely with a Maxwell element under creeping conditions using the formula: $J(t) = J(0) + t/\eta$, from which the viscosity $\eta$ can be derived from the slope, and the elastic modulus $G(=1/J(0))$ forms the intercept.

Uses

Transparent conductors and conductive articles of the present invention have many uses. For example, they can be used for EMI shielding and in photovoltaic devices. They are also useful in display devices for electrical switch light-emitting or light-transmitting properties of a display pixel, for example in liquid crystal or organic light-emitting diode displays, or to form touch screens in various types of displays. In touch screen applications, the optical transparency is limited by the width of conductive traces (lines and intersections) used to form the conductive electrodes, their density and uniformity. It is highly desirable to limit the conductive micro-wires to an average width of less than or equal to 4 μm. Various printing and replication methods can potentially be used to form such thin conductive traces.

The devices provided by the present invention can also have various components normally used in combination with a pattern of conductive micro-wires to provide the desired properties and functions of the devices. For example, the pattern of conductive micro-wires can be connected to at least one electrode or electrical contact.

Method of Preparing Conductive Articles

The present invention can be illustrated at least in part, by reference to the FIGS. provided with this disclosure.

Figure 2C:
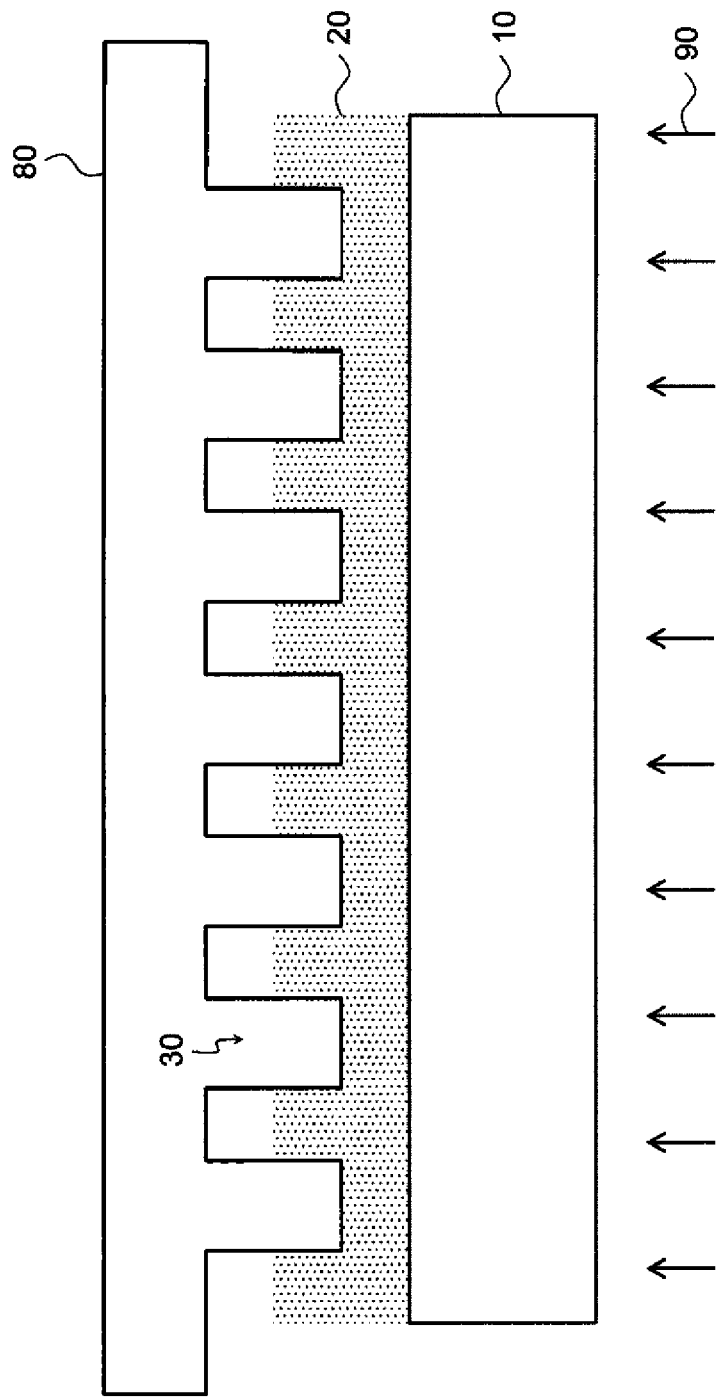

Referring to FIGS. 1 and 2A-2H, transparent flexible substrate 10 is provided in step 100 (FIG. 2A) in a suitable manner. Photocurable layer 20 (or also known as a photoresist layer) is provided over transparent flexible substrate 10 in feature 105 (FIG. 2B). Useful photocurable layer compositions are described below.

Transparent flexible substrate 10 can be formed from any conventional material that can have a suitable flexibility as defined by it having a distortion temperature of less than 150° C. or even less than 140° C. as determined by the ASTM D648 at 66 psi (455 kPa). It is particularly useful that transparent flexible substrate 10 comprises a transparent flexible material selected from but not limited to, films of polyesters such as poly(ethylene terephthalate) and poly (ethylene naphthalate), polycarbonates, polyamides, polyimides, flexible glasses, cellulose triacetate, polystyrene, and other materials that would be known in the art.

Photocurable layer 20 has an average dry thickness of at least 0.1 μm and up to and including 100 μm or at least 3 μm and up to and including 20 μm. For example, photocurable layer 20 can have a softening point of at most 60° C. More importantly, the photocurable composition used to make the photocurable layer has a viscosity of less than 5,000 Pascal-seconds, or typically less than 3,000 Pascal-seconds, at the temperature at which the micro-channels are formed as described below.

Depending upon the use of the conductive article prepared by the present invention, photocurable layer 20 can further be overlaid with a protective sheet (not shown) for easier and flexible handling, manipulation, or manufacturing.

Photocurable layer 20 can be composed of any useful photocurable composition that will provide the properties described above, and particularly a photocurable composition comprising a crosslinkable material. For example, the photocurable composition can be a UV curable acrylate composition comprising a multi-functional acrylate monomer and a photoinitiator that generates free radicals upon exposure to UV radiation. The photocurable composition can also be a photocurable epoxy composition that comprises a multi-functional epoxy compound and a photoinitiator that generates an acid upon exposure to visible light. The following discussion relates to a particularly useful photocurable composition but it is to be understood that the present invention is not limited to using only this photocurable composition.

A particularly useful photocurable composition comprises a compound that generates an acid upon exposure to radiation of at least 190 nm and up to and including 500 nm, a multifunctional epoxy compound having an epoxy equivalent molecular weight of less than 1,000, and an epoxysilane oligomer.

In such photocurable compositions and in the conductive articles and devices of this invention, an essential epoxysilane can be represented by the following Structure (I):

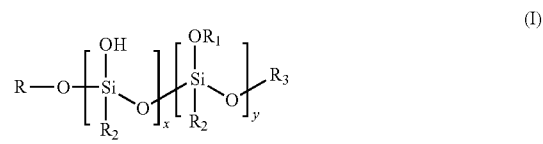

wherein R and $R_1$ are independently substituted or unsubstituted alkyl groups, $R_2$ is a substituted or unsubstituted linear, branched, or cyclic alkyl group or an alkyl ether residue substituted with an epoxide, $R_3$ is hydrogen or a substituted or unsubstituted alkyl, and $x+y \geq 2$.

Such useful epoxysilane oligomers can be represented by Structure (I) noted above wherein R and $R_1$ are independently substituted or unsubstituted alkyl groups having 1 and up to and including 10 carbon atoms (both linear and branched groups) and including aryl-substituted alkyl (arylalkyl) groups. In particular R and $R_1$ are independently substituted or unsubstituted arylalkyl groups having at least 7 carbon atoms such as substituted or unsubstituted benzyl groups.

$R_2$ is a substituted or unsubstituted linear, branched, or cyclic alkyl group having up to and including 30 carbon atoms or an alkyl ether residue substituted with an epoxide $R_3$ is hydrogen or a substituted or unsubstituted alkyl (linear or branched groups, including cyclic alkyl groups) or an unsubstituted arylalkyl group, each having up to 10 carbon atoms.

In Structure (I), $x+y \geq 2$, or more particularly, the sum of x and y is at least 3.

For example, a useful epoxysilane oligomer can have the general structure represented by the following Structure (Ia):

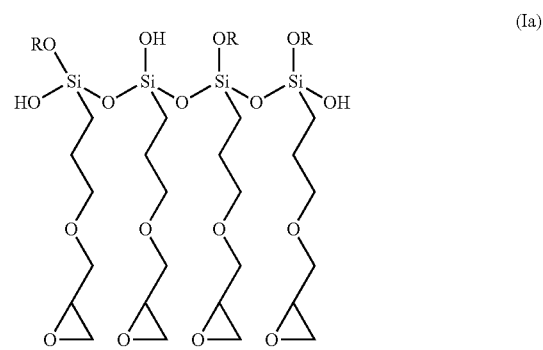

wherein R in Structure (Ia) is hydrogen or a substituted or unsubstituted alkyl group having 1 to 10 carbon atoms (linear or branched groups). For example, R can be a methyl or ethyl group. The epoxysilane oligomer in Structure (III), or any of the compounds described herein, can be characterized by the alcohol content and epoxy functionality.

The alcohol content of an epoxysilane oligomer can be measured by hydrolysis in water followed by gas chromatography to determine the amount of methanol liberated (methanol released). The epoxy functionality can be expressed in terms of meq/gram or epoxy equivalent weight.

A useful epoxysilane oligomer that is commercially available is Coatosil MP200 silane (available from Momentive Performance Materials Inc.), which epoxysilane oligomer has an alcohol content of about 22% and epoxy content of about 4.785 meq/gram. It is also possible that the epoxysilane oligomer have a softening point less than or equal to 20° C.

One or more epoxysilane oligomers are present in the photocurable composition (and coated photocurable layers) in an amount of at least 10 weight % and up to and including 90 weight %, or typically at least 10 weight % and up to and including 70 weight %, based on total photocurable composition total solids.

A second essential component of this particular photocurable composition is a compound (or mixture thereof) that provides or generates an acid having a pKa of less than 2 or typically a pKa less than 0 during exposure to radiation having a $\lambda_{max}$ of at least 190 nm and up to and including 500 nm, or typically radiation having a $\lambda_{max}$ of at least 250 nm and up to and including 450 nm to initiate reaction with epoxy groups.

Particularly useful acid-generating compounds are onium salts that decompose upon irradiation. An onium salt (also known as an onium compound) is a compound that is formed by the attachment of a proton to a mononuclear parent hydride of a Group 15 element (for example nitrogen and phosphorus), a chalcogen of Group 16 (for example sulfur and selenium), or a halogen (such as fluorine, chlorine, and iodine). Particularly useful onium salts include but are not limited to, sulfonium salts, phosphonium salts, iodonium salts, aryldiazonium salts, hydroxyimide sulfonates, hydroxyimino sulfonates, and nitrobenzyl sulfonate esters. The sulfonium salts, phosphonium salts, and iodonium salts are particularly useful, including but not limited to arylsulfonium salts and aryliodonium salts. Useful onium salts have substituted aryl groups and strong acid anions such as hexafluorophosphate, tetrafluoroborate, hexofluoroarsenate, and hexafluoroantimonate. Representative examples of useful onium salts are triphenyl sulfonium triflate, trifluoromethylsulfonic acid, and bis(4-t-butylphenyl) iodonium triflate. Other useful onium salts are described for example in U.S. Pat. No. 4,210,449 (Schlesinger et al.), U.S. Pat. No. 4,273,668 (Crivello), and U.S. Pat. No. 4,491,628 (Frechet et al.), the disclosures of which are incorporated herein by reference with respect to the onium salts.

More particularly, the acid generating compound is an onium salt of a Group V-A element, an onium salt of a Group VI-A element, or an aromatic halonium salt. Examples of triaryl-substituted sulfonium complex salts useful as acid-generating compounds include but are not limited to, triphenylsulfonium tetrafluoroborate, triphenylsulfonium hexafluorophosphate, triphenylsulfonium hexafluoroantimonate, tritolylsulfonium hexafluorophosphate, anisyldiphenylsulfonium hexafluoroantimonate, 4-butoxyphenyldiphenyl-sulfonium tetrafluoroborate, 4-chlorophenyldiphenylsulfonium hexafluoro-antimonate, 4-acetoxy-phenyldiphenylsulfonium tetrafluoroborate, 4-acetamidophenyldiphenylsulfonium tetrafluoroborate, 4-[4-(2-chlorobenzoyl)-phenylthio]phenylbis(4-fluorophenyl)sulfonium hexafluoroantimonate (Adeka Optmer SP-172 by Asahi Denka Kogyo KK).

Examples of aryl-substituted iodonium complex salt acid-generating compounds include but are not limited to, diphenyliodonium trifluoromethanesulfonate, (p-t-butoxyphenyl) phenyliodonium trifluoromethanesulfonate, diphenyliodonium p-toluenesulfonate, (p-t-butoxyphenyl)-phenyliodonium p-toluenesulfonate, bis(4-t-butylphenyl)iodonium hexafluorophosphate, and diphenyliodonium hexafluoroantimonate.

One or more compounds that generate the desired acid(s) are generally present in the photocurable composition (and dry photocurable layer) in an amount of at least 0.1 weight % and up to and including 20 weight %, or more likely at least 1 weight % and up to and including 10 weight %, based on the total photocurable composition solids (or dry photocurable layer weight).

Still another essential component of the noted photocurable composition is a multifunctional epoxy compound (or mixture thereof). The multifunctional epoxy compounds generally have an epoxy equivalent molecular weight of less than 1000, and more likely less than 500. Thus, these compounds contain a sufficient number of epoxy groups in one molecule for efficient curing reactions with the acid-generating compounds described above. In addition, the multifunctional epoxy compound can have a molecular weight of at least 2,000 and up to and including 11,000, or more likely at least 2,000 and up to and including 8,000, as determined by size exclusion chromatography. Moreover, the multifunctional epoxy compound can have a softening point of 20° C. or more.

Examples of useful multifunctional epoxy compounds include but are not limited to, phenol novolak epoxy resins, o-cresol novolak epoxy resins, triphenyl novolak epoxy resins, and bisphenol A novolak epoxy resins. The multifunctional Bisphenol A novolak epoxy resins are particularly useful, having a functionality of 5 or more. Commercial examples of useful multifunctional epoxy compounds are available as Epicoat 157 from Japan Epoxy Resin Co., Ltd. (Japan), Epiclon N-885 from Dainippon Ink and Chemicals Inc. (Japan), and Epon SU-8 from (Momentive Specialty Chemicals Inc.).

The amount of one or more multifunctional epoxy compounds used in the photocurable composition (and coated photocurable layers) is at least 10 weight % and up to and including 90 weight %, or typically at least 30 weight % and up to and including 90 weight % based on total photocurable composition solids.

In some embodiments, the photocurable composition comprises a multifunctional epoxy compound that is represented by the following Structure (II):

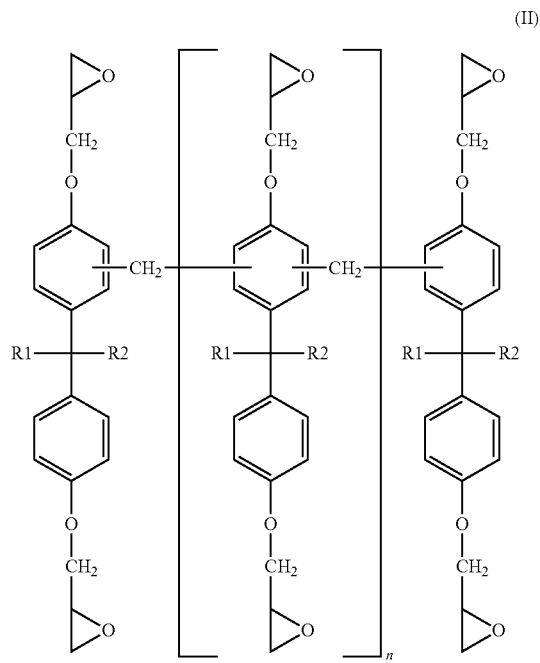

wherein R1 and R2 are independently hydrogen or methyl, and n is 0 or a positive integer, such as at least 1 and more likely at least 3.

The photocurable compositions useful in this invention can also comprise one or more photosensitizers that can enhance sensitivity to the radiation used to initiate curing. A variety of photosensitizers are known in the art such as aromatic tertiary amines, aromatic tertiary diamines and certain aromatic polycyclic compounds such as substituted or unsubstituted anthracene compounds, as described for example in U.S. Pat. No. 4,069,054 (Smith) and U.S. Pat. No. 7,537,452 (Dede et al.), the disclosures of which are incorporated herein by reference. Particularly useful photosensitizers include unsubstituted anthracene and substituted anthracenes such as 9,10-diethoxyanthracene and 2-t-butyl-9,10-diethoxyanthracene. Other useful photosensitizers include but are not limited to, N-alkyl carbazole such as N-ethyl carbazole, N-ethyl-3-formayl carbazole, 1,4,5,8,9-pentamethyl carbazole, and N-ethyl-3,6,dibenzoyl-9-ethyl-carbazole. Naphthols can be used as photosensitizers and include but are not limited to, 1-naphthol, β-naphthol, α-naphthol methyl ether, and α-naphthol ethyl ether. Mixtures of photosensitizers can be used if desired.

One or more photosensitizers can be present in the photocurable composition (and coated photocurable layers) in an amount of at least 0.1 weight % and up to and including 10 weight %, or more likely at least 0.2 weight % and up to and including 5 weight %, based on the total solids in the photocurable composition (or dry coated photocurable layer weight).

The photocurable composition can further comprise one or more of an adhesion promoter, glycidyl ether reactive monomer, filler, lubricant, coating surfactant, matting agent, or conductive inorganic or organic particles, all of which are known in the art.

The components of the photocurable composition can be dissolved or dispersed within a suitable solvent or mixture of solvents. Useful organic solvents include but not limited to, ketones (such as acetone, 2-butanone, 2-pentanone, 3-pentanone, methyl isobutyl ketone, methyl t-butyl ketone, cyclopentanone, and cyclohexanone), ethers (such as dipropylene glycol dimethyl ether, and dipropylene glycol diethyl ether), tetrahydrofuran, 1,3-dioxolane, 1,4-dioxane, dimethoxyethane, diglyme, triglyme, esters (such as ethyl acetate, propyl acetate, butyl acetate, butyl cellulose acetate, carbitol acetate, propylene glycol monomethyl ether acetate, and gamma-butyrone lactone). Other useful solvents include those that can be used (mixed) with the organic solvents include alcohols and aromatic and aliphatic hydrocarbons.

A prepared photocurable composition can thus be formulated and then be applied over transparent flexible substrate 10 by any coating method including but not limited to, spin coating, ultrasonic coating, extrusion hopper coating, blade coating, slide hopper coating, curtain coating, gravure coating, spray coating, air knife coating, and other methods known in the art. The applied photocurable composition can be dried on transparent flexible substrate 10 to form photocurable layer 20 as shown in FIG. 2B. For example, the applied photocurable composition can be formed on transparent flexible substrate 10 at a temperature of less than or equal to 130° C.

Referring to FIGS. 1 and 2C, mold 80 or stamp is pressed against the photocurable layer 20 to imprint (form) one or more micro-channels 30 in a desired pattern in photocurable layer 20 in feature 110. The micro-channel formation or imprinting process is carried out so that the average depth to average width ratio of the cured micro-channels (before and after curing) is greater than 1 and up to any desired aspect ratio. But in many embodiments, the average depth to average width ratio (before and after curing) is greater than 1 and up to and including 5 or even at least 1 and up to and including 3, or up to and including 2.5. The dimensions of the formed micro-channels can be achieved by properly adjusting the size features on the imprinting stamp and the thickness of the dry photocurable layer.

In many embodiments, the pattern of micro-channels is formed within the photocurable layer so that the average depth to average width ratio of the resulting micro-channels is greater than 1 and up to and including 3, and the photocurable layer is then exposed to curing ultraviolet radiation to form a pattern of photocured micro-channels having an average width of less than or equal to 3 and an average depth to average width ratio that is greater than 1 and up to and including 3.

Figure 2D:
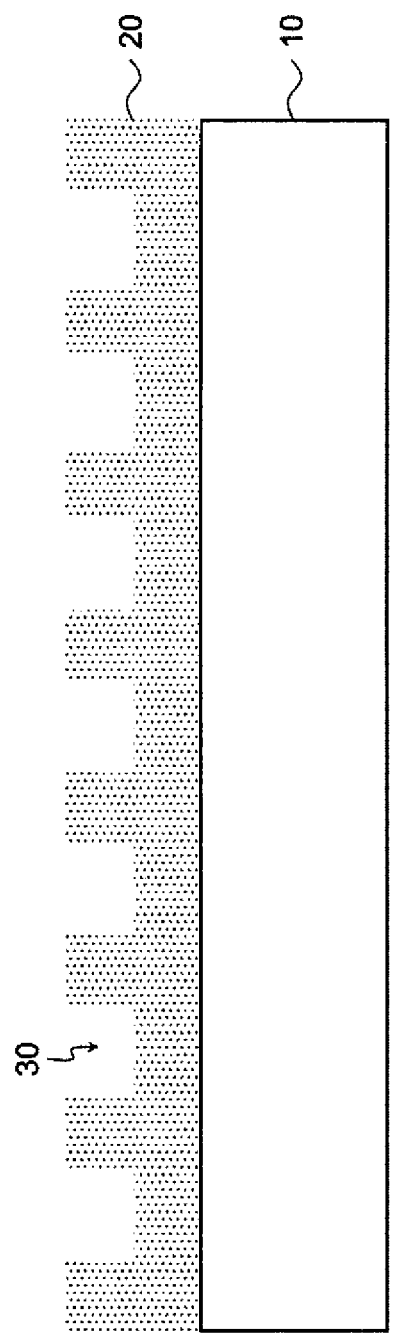

Once the micro-channels are formed as noted, photocurable layer 20 is exposed using an external radiation source 90 (such as a source of ultraviolet or visible radiation) to effect curing as noted in feature 115, and releasing mold 80 from the photocurable layer 20, leaving one or more cured micro-channels 30 within photocurable layer 20 on transparent flexible substrate 10 (FIG. 2D). The curing exposure can be made through transparent flexible substrate 10 or through mold 80 (not shown) when it is transparent. Mold 80 can be formed from various known materials. To facilitate curing exposure through mold 80, it can be prepared from materials that are fairly transparent to an external curing radiation source to allow photocurable layer 20 to be cured during pressing (imprinting). Thus, mold 80 can be prepared from materials including but not limited to, quartz, silicone, organic polymers, siloxane polymers, borosilicate glass, fluorocarbon polymers, cyclic polyolefin, metals, and combinations thereof. To facilitate release of mold 80 from cured photocurable layer 20, mold 80 can be treated with a surface modifying agent that is well known in the art, such as a fluorocarbon silylating agent. The surface modifying agent may be applied, for example, from a plastic surface, a chemical vapor deposition process, a solution treatment, or a vapor treatment involving a solution.

For example, mold 80 can comprise a cured silicone selected from, for example, a condensation curable silicone, an addition-curable (hydrosilylation curable) silicone, a free radical curable silicone, or a cationic-curable silicone. In some embodiments, the curable silicone can be a photocurable silicone, such as a UV and visible light curable silicone. In some embodiments, the curable silicone can further comprise reinforcing filler such as silica or quartz.

More particularly, mold 80 comprises an addition (or hydrosilylation) cured silicone. Such a cured silicone composition is typically formed by reacting a multiple ethylenically unsaturated group-containing organo-polysiloxane with an organo-polysiloxane containing a multiplicity of Si—H bonds per molecule. The reaction is typically facilitated by the presence of a platinum-containing catalyst.

With the use of photocurable layer 20, the pressing (imprinting) pressure of mold 80 can be adjusted depending on the imprinting time and temperature. For example, the pressing pressure can be less than 2 megaPascals. The pressing time can vary from a fraction of a second to minutes and the pressing temperature is generally less than 100° C. Thus, such forming of the pattern of micro-channels can be achieved out at a temperature of less than or equal to 100° C. or even less than 90° C.

Photocured micro-channels 30 can have an average width of a few nanometers to many micrometers and an aspect ratio (average depth to average width) of greater than 1 as described above. For example, photocured micro-channels 30 can have an average width of less than 50 μm and an aspect ratio greater than 1. Typically, photocured micro-channels 30 have an average width of less than 10 μm and an aspect ratio greater than 1 and up to and including 5. In the practice of the present invention, photocured micro-channels 30 have an average width of at least 0.5 μm and up to and including 4 μm or up to and including 3 μm, and an aspect ratio of at least 1 and up to and including 3, and the photocured micro-channels are formed on transparent flexible substrate 10 composed of a polyester film, flexible glass, or polycarbonate film and having the desired distortion temperature of less than 150° C. as described above. The average dimensions of both the non-cured micro-channels and the photocured micro-channels fall within the noted parameters but the dimensions of the photocured micro-channels can vary from the dimensions of the non-cured micro-channels by ±5%.

Figure 2E:
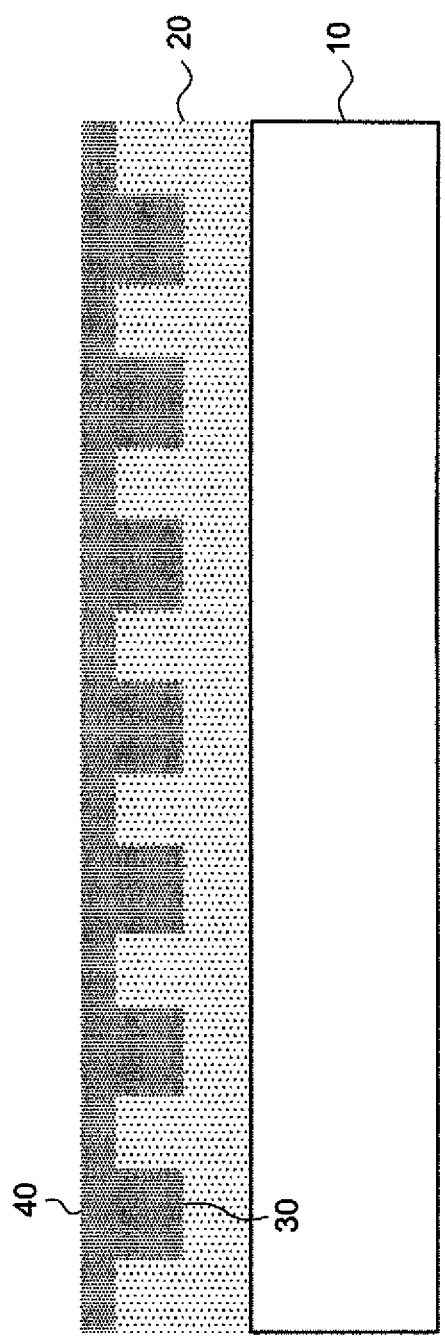

Referring to FIG. 2E, photocured micro-channels 30 formed in accordance with the present invention can be filled with conductive composition ("fill" or "ink") 40 in a filling process, or coated or otherwise applied over photocured layer 20 and photocured micro-channels 30 in feature 120. Conductive composition (ink) 40 can comprise one or more conductive materials (such as conductive metal nanoparticles) and a liquid carrier (or solvent).

Figure 2F:
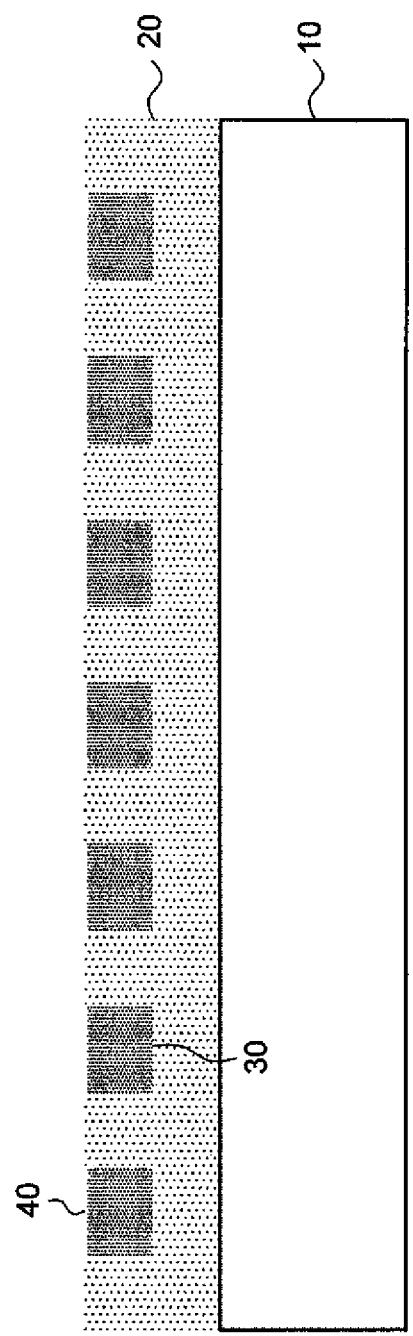

Excess conductive composition (ink) 40 can be removed (for example, by wiping) in feature 125 from the transparent flexible substrate surface outside the photocured microchannels while leaving conductive composition (ink) 40 predominantly within photocured micro-channels 30 (not shown in FIG. 2F). This removal of excess conductive composition can be done for example by any mechanical means.

The conductive composition (ink) filling and wiping actions can be repeated if necessary to increase the microchannel filling efficiency. In general, there is a waiting time between each ink filling and wiping cycle. The waiting time should to be sufficiently long to overcome the barrier of dynamic wetting of ink on the substrate surface. The dynamic wetting can simply be a replacement of surface air or gas molecules with the liquid conductive composition (ink).

It is desirable that the filling efficiency be at least 45% and more typically at least 50% and even up to 100%. This filling efficiency refers to the percentage of the micro-channel volume that is occupied by the conductive composition that is applied.

Figure 2G:
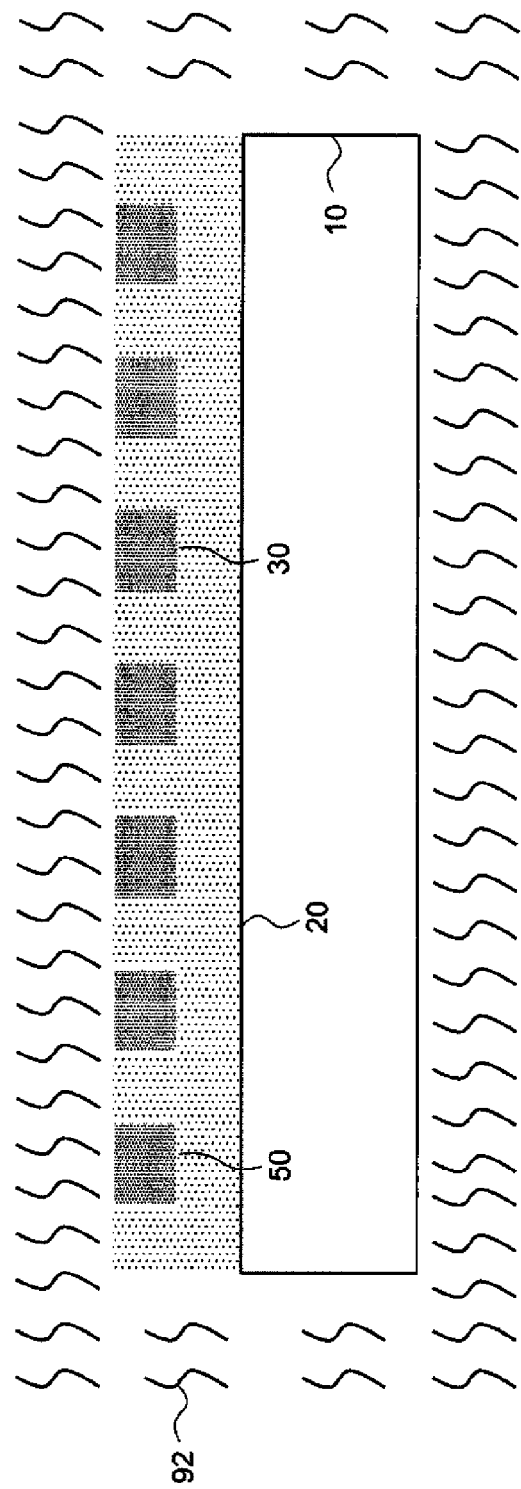

Referring to FIG. 2G, the liquid carrier can be removed by drying in feature 130 of FIG. 1, for example by the application of heat 92 to evaporate the liquid carrier leaving the conductive composition (ink) only in photocured microchannels 30 forming micro-wires 50 in photocurable layer 20 on transparent flexible substrate 10. Useful drying temperatures are up to but less than 85° C. After drying, a wet polishing step can be used to remove residual photocurable composition (ink) between the micro-channels. The conductive composition (ink) can be further cured by light, or heat, or by a reagent including, for example, a vapor or a liquid composition, to further increase the conductivity of microwires 50, or by any combination of these procedures. For example, the conductive composition in the micro-channels can be cured at a temperature greater than or equal to 90° C.

The conductive composition (ink) can include, for example, conductive particles such as conductive metal nano-particles (including conductive silver nano-particles, conductive palladium nano-particles, and conductive platinum nano-particles), a conductive polymer (such as a polythiophene or polyaniline), a soluble conductive precursor, and other materials known in the art. The conductive composition can include a combination of conductive materials of the same or different types. In many embodiments, the conductive material is a dispersion of conductive metal particles such as an aqueous dispersion of silver nanoparticles. Thus, it is desirable that the pattern of conductive micro-wires comprises a conductive silver, palladium, platinum, copper, nickel, or indium tin-oxide, or any combination thereof.

The metal nano-particles such as silver nano-particles can be present in the conductive composition in an amount of at least 10 weight % and up to and including 90 weight %, based on total conductive composition solids. In the practice of one embodiment of the present invention, the silver nanoparticles have a concentration of greater than 50 weight %. This is to ensure that the imprinted micro-channels can be filled effectively at higher volume fraction (efficiency) and the resulting conductive micro-wires have low sheet resistance as described above.

For example, aqueous silver nano-particle dispersions useful in the present invention can be prepared at high concentrations using a water-soluble polymer having both carboxylic acid and sulfonic acid groups. Such polymers can be prepared by various polymerization methods that are well known in the art such as free radical polymerization of a mixture of ethylenically unsaturated polymerization monomers that have sulfonic acid side groups and ethylenically unsaturated polymerizable monomers that have carboxylic acid side groups. Useful polymers can also be prepared by a post-modification of a pre-formed copolymer that has recurring units comprising carboxylic acid side groups. Sulfonic acid groups can be introduced in a formed polymer by sulfonation of recurring units that do not have carboxylic acid side groups. For example, poly(styrene sulfonic acid-co-maleic acid) can be prepared by polymerization of a monomer mixture containing both styrene and maleic anhydride to form poly(styrene-co-maleic anhydride) and subsequent sulfonation and hydrolysis of the noted polymer.

Various ethylenically unsaturated monomers can be used to form the polymers for use to make useful silver nanoparticle dispersions as conductive compositions (inks). Suitable ethylenically unsaturated polymerizable monomers comprising sulfonic acid side groups include but are not limited to, styrene sulfonic acid, 3-sulfopropyl acrylate, 3-sulfopropyl methacrylate, 2-sulfoethyl methacrylate, 3-sulfobutyl methacrylate, and 2-acrylamido-2-methylpropane sulfonic acid. Suitable ethylenically unsaturated polymerizable monomers containing carboxylic acid side groups include but are not limited to, acrylic monomers such as acrylic acid, methacrylic acid, ethacrylic acid, itaconic acid, maleic acid, fumaric acid, monoalkyl itaconate including monomethyl itaconate, monoethyl itaconate, and monobutyl itaconate, monoalkyl maleate including monomethyl maleate, monoethyl maleate, monobutyl maleate, citraconic acid, styrene carboxylic acid, 2-carboxyethyl acrylate, and 2-carboxyethyl acrylate oligomers.

Useful water-soluble polymers having both pendant carboxylic acid and sulfonic acid groups can have various microstructures, such as, for example, random copolymers, block copolymers, or graft copolymers. Such polymers can be linear, branched, and hyper-branched in form. The polymers can also comprise up to 10% of recurring units that comprise neither sulfonic acid groups nor carboxylic acid groups.

For example, the ratio of the sulfonic acid side group to carboxylic acid side group can be at least 0.05:1 and up to and including 5:1 or at least 0.1:1 and up to and including 4:1 or more likely at least 0.5:1 and up to and including 2:1. The molecular weight of the useful polymers is typically at least 500 and up to and less than 500,000, or up to but less than 100,000, or at least 500 and up to and including 50,000.

Useful silver nano-particle dispersions can be provided, for example, by forming an aqueous mixture of a water-soluble polymer and a reducing agent, adding a source of silver ion, and growing the silver nano-particles in the dispersion. Suitable reducing agents are typically agents that are capable of reducing metals (such as silver ion) in aqueous dispersions and include but are not limited to, hydrazine, hydrazine hydrate, hydrogen, sodium borohydride, lithium borohydride, ascorbic acid, formic acid, aldehydes, and amines including a primary amine, a secondary amine, and a tertiary amine, and any combination thereof. Suitable silver ion sources can be any water-soluble silver compound or salt such as silver nitrate, silver acetate, and $AgClO_4$. The reaction temperatures to form silver nano-particles be at least room temperature (about 20° C.) and up to and including 95° C., such as above 60° C.

Further details for making the useful silver nano-particles are provided in copending and commonly assigned U.S. Ser. No. 13/757,891 (filed Feb. 4, 2013 by Wang et al.) that is incorporated herein by reference for these details of the silver nano-particle containing conductive composition.

The mean size of the useful silver nano-particles in the dispersions can be at least 5 nm and up to and including 500 nm, and can be varied by the amount of water-soluble polymer, the reaction temperature, and the speed and method of agitation during reaction. In certain embodiments, the conductive composition can have a light absorption such that the wavelength absorbance maximum is at least 400 nm and up to and including 500 nm.

The silver nano-particle dispersions useful in the present invention can be formulated into various conductive compositions (inks) and coating formulations for various applications.

While it is desirable that the photocured micro-channels are completely filled with conductive composition, in reality it is likely that the filling efficiency can be less than 100%. In such embodiments, the average width and the average depth of the conductive micro-wires can be less than the average width and the average depth of the photocured micro-channels. The average width and the average depth of the conductive micro-wires can be as much as 50% less than the average width and the average depth of the micro-channels. However, in most instances, the difference these average dimensions is generally less than 30%.

It is thus desirable that the conductive micro-wires have an average width of the conductive micro-wires is at least 0.5 μm and up to and including 4 μm and typically at least 1 μm and up to and including 3 μm. The average depth to average width ratio of the conductive micro-wires is generally at least 0.5 and up to and including 3, or typically at least 0.75 and up to and including 3. The average dimensions of the conductive micro-wires are independent of the average dimensions of the photocurable micro-channels or photocured micro-channels, although it is desirable that such average dimensions be as close as possible.

It is not illustrated, but the outer surface of each conductive micro-wire can be polished in the presence of water or water vapor (a wet polishing medium) to further enhance the pattern of conductive micro-wires on the transparent flexible substrate. The wet polishing can be performed either before or after curing the conductive micro-wires. The means for this polishing can be a mechanical polishing means comprising for example a soft polishing pad that can also be wet with water. Such polishing materials include but are not limited to, a fabric cloth, synthetic hydrogel comprising cross-linked water-soluble polymers, and open cell foams comprised of foamed materials such as foamed polyurethane. A soft polishing pad can be mounted on a rotating disc, a roller, or a wiper blade. Excellent polishing results can be obtained by a combination of translation, rotation, and vibration of the polishing pad.

In particularly useful embodiments, the polishing pad surface does not contain any significant amount of large abrasive particles that can cause surface scratching or mechanical damage to the conductive micro-wires. The polishing step in the presence of water effectively removes undesired residual cured and treated conductive composition (ink) to enhance the transparency of imprinted micro-wire structure, resulting in a highly transparent article comprising a transparent flexible substrate and photocured layer having imprinted conductive micro-wires forming a conductive micro-wire pattern.

Thus, the present invention can be used to provide a conductive electrode (article) comprising very fine patterns of conductive micro-wires entrenched in micro-channels on transparent substrate wherein the micro-channels comprise a photocured layer and the conductive micro-wires comprise conductive metal nano-particles (such as silver nano-particles). For example, the pattern of conductive micro-wires can be connected to at least one electrical contact.

Either before or after wet polishing, the formed conductive micro-wires can be cured by heat, or light, or, exposure to such a halide including an inorganic halide compound such as, for example, sodium chloride, potassium chloride, hydrogen chloride, calcium chloride, magnesium chloride, sodium bromide, potassium bromide, and hydrogen bromide, or mixtures thereof. This halide treatment can be done by using a halide vapor source such as HCl vapor at a temperature less than 60° C. or the treatment is done at a lower temperature such as less than 50° C., less than 40° C., or less than 30° C., or even at room temperature.

Figure 2H:
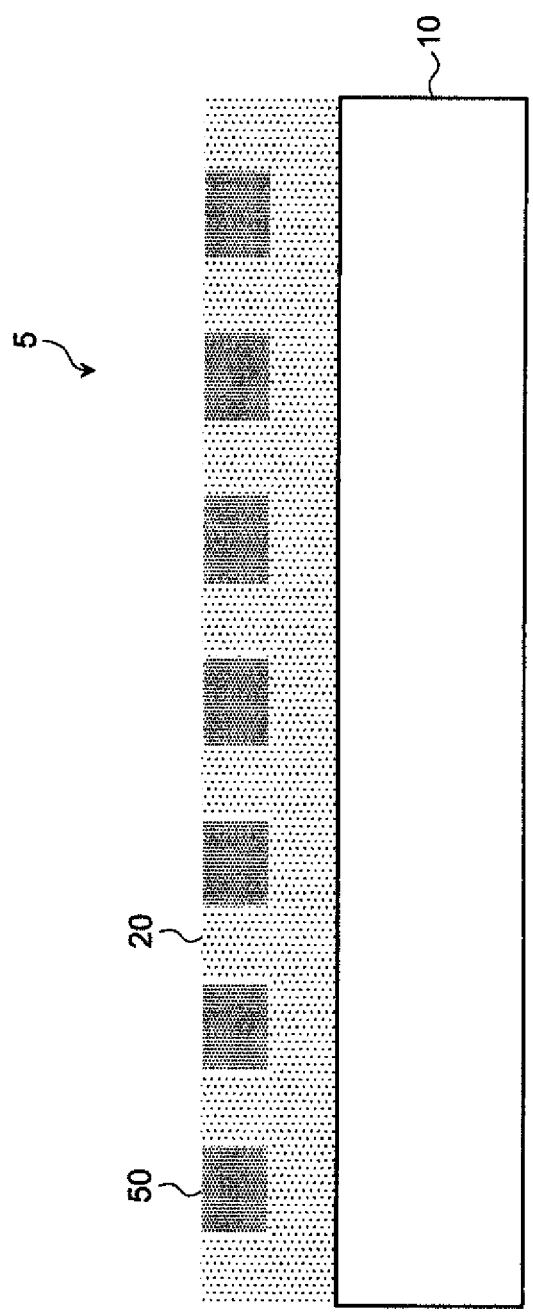

Referring to FIG. 2H, transparent flexible substrate 10 has photocured layer 20 with conductive micro-wires 50 resulting in micro-wire structure 5 having excellent conductivity and transparency through transparent flexible substrate 10. The conductive micro-wires formed in this manner can have an average width of less than or equal to 4 μm and each of at least 50% of the total conductive micro-wires has a sheet resistance of less than 0.025 ohms/sq.

Figure 3:
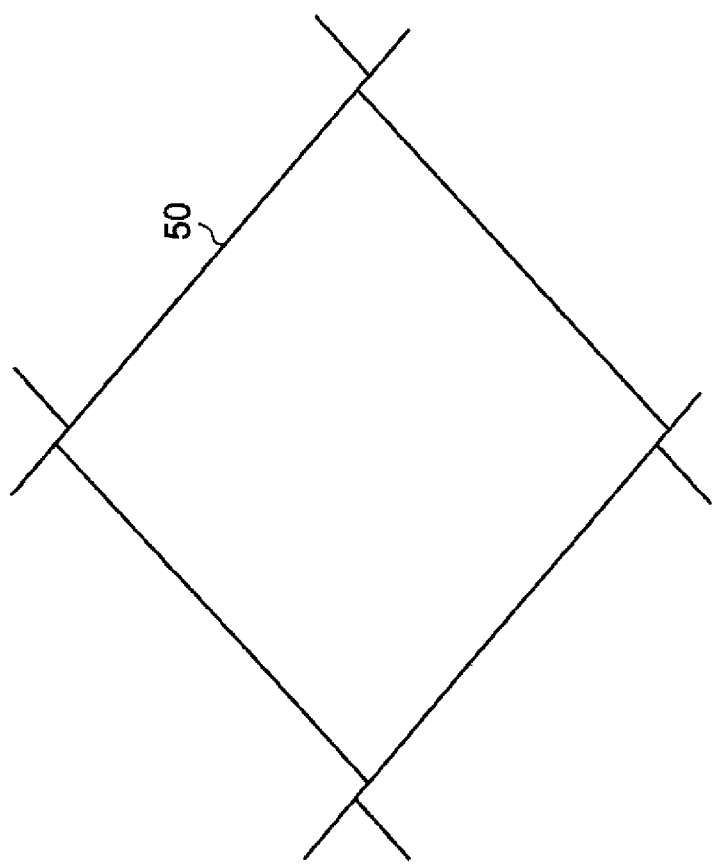
FIG. 3 is a diagram of a single diamond pattern formed on a substrate used to form an imprint in a photocurable layer according to some features of the method of the present invention.

FIG. 3 illustrates a useful embodiment wherein silver nano-particle dispersions are patterned to form conductive micro-wire grids 50, mesh or other conductive micro-wire patterns that have low apparent visibility, high transparency (for example, greater than 80% or greater than 85% visible light transmission or transmittance) and low electrical resistivity (for example, less than 15 ohms/square, less than 10 ohms/square, or even less than 5 ohms/square). In certain embodiments, such conductive micro-wires 50 have an average width of at least 0.5 μm and up to and including 4 μm and an aspect ratio of greater than 1 and up to and including 3.

It is also possible to subject the pattern of conductive micro-wires to further processes for example to enhance conductivity. For example, some conductive articles and devices of this invention can have a pattern of conductive micro-wires comprising silver that has been electrolessly plated with copper, nickel, gold, platinum, or palladium In most embodiments of this invention, the conductive article exhibits a haze of less than 10% and a light transmission of at least 80%, or more likely a haze of less than 5% and a light transmission of at least 85%.

Figure 4:
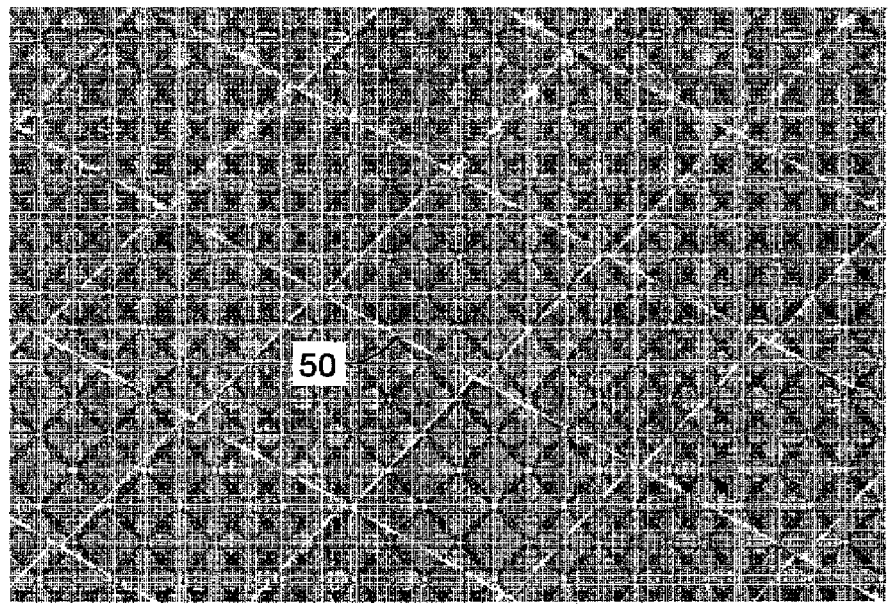
FIG. 4 is an electron micrograph of conductive micro-wires that can be formed according to the method of the present invention.

FIG. 4 is a micrograph image of a grid of conductive micro-wires 50 prepared according to the method of the present invention.

The present invention provides at least the following embodiments and combinations thereof, but other combinations of features are considered to be within the present invention as a skilled artisan would appreciate from the teaching of this disclosure:

1. A method for making a micro-wire pattern in an article, the method comprising:

providing a photocurable layer on a transparent flexible substrate that has a distortion temperature of less than 150° C., forming a pattern of micro-channels within the photocurable layer that has a viscosity of less than 5,000 Pascal-seconds at the temperature at which the micro-channels are formed, the micro-channels having an average width of less than or equal to 4 μm and an average depth to average width ratio that is greater than or equal to 1, exposing the photocurable layer to curing ultraviolet radiation to form a pattern of photocured micro-channels within a photocured layer on the transparent flexible substrate, the photocured micro-channels having an average width of less than or equal to 4 μm and an average depth to average width ratio that is greater than or equal to 1, applying a conductive composition comprising metal nano-particles to the photocured micro-channels, removing any excess conductive composition outside the photocured micro-channels while leaving conductive composition within the pattern of photocured micro-channels, curing the conductive composition in the pattern of photocured micro-channels to provide a pattern of conductive micro-wires in the pattern of photocured micro-channels on the transparent flexible substrate, and optionally, polishing the pattern of conductive micro-wires on the transparent flexible substrate, wherein each of at least 50% of the conductive micro-wires has a sheet resistance of less than 0.025 ohms/sq.

2. The method of embodiment 1, comprising:

forming a pattern of micro-channels within the photocurable layer so that the average depth to average width ratio of the micro-channels is greater than 1 and up to and including 3, and exposing the photocurable layer to curing ultraviolet radiation to form a pattern of photocured micro-channels having an average width of less than or equal to 3 μm and an average depth to average width ratio that is greater than 1 and up to and including 3.

3. The method of embodiment 1 or 2, comprising forming the pattern of micro-channels at a temperature less than or equal to 130° C.

4. The method of any of embodiments 1 to 3, comprising curing the conductive composition at a temperature greater than or equal to 90° C.

5. The method of any of embodiments 1 to 4, comprising removing any excess conductive composition using mechanical means.

6. The method of any of embodiments 1 to 5, wherein the photocurable layer comprises a crosslinkable material.

7. The method of any of embodiments 1 to 6, wherein the conductive composition comprises silver nano-particles.

8. The method of any of embodiments 1 to 7, wherein the photocured micro-channels and resulting conductive micro-wires have an average width of at least 0.5 μm and up to and including 4 μm.

9. The method of any of embodiments 1 to 8, wherein the photocurable layer comprises a compound that generates an acid upon exposure to radiation of at least 190 nm and up to and including 500 nm, a multifunctional epoxy compound having an epoxy equivalent molecular weight of less than 1,000, and an epoxysilane oligomer that is represented by the following Structure (I):

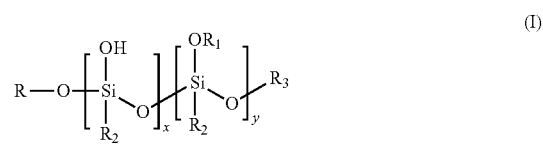

wherein R and $R_1$ are independently substituted or unsubstituted alkyl groups, $R_2$ is a substituted or unsubstituted linear, branched, or cyclic alkyl group or an alkyl ether residue substituted with an epoxide, $R_3$ is hydrogen or a substituted or unsubstituted alkyl, and $x+y \geq 2$.

10. A conductive article prepared according to the method of any of embodiments 1 to 9, the article comprising a transparent flexible substrate and a pattern of conductive micro-wires disposed thereon, which conductive micro-wires have an average width of less than or equal to 4 μm and an average depth to average width ratio greater than 1, and each of at least 50% of the conductive micro-wires has a sheet resistance of less than 0.025 ohm/sq.

11. The conductive article of embodiment 10 that exhibits a haze of less than 10% and a light transmission of at least 80%.

12. The conductive article of embodiment 10 or 11 that exhibits a haze of less than 5% and a light transmission of at least 85%.

13. The conductive article of any of embodiments 10 to 12, wherein the pattern of conductive micro-wires comprises conductive silver, palladium, platinum, copper, nickel, or indium tin-oxide.

14. The conductive article of any of embodiments 10 to 13, wherein the pattern of conductive micro-wires comprises at least silver, the average width of the micro-wires is at least 0.5 μm and less than or equal to 4 μm and the average depth to average width ratio is greater than 0.5 and up to and including 3.

15. A device comprising a conductive article of any of embodiments 10 to 14, the conductive article comprising a transparent flexible substrate and a pattern of conductive micro-wires disposed thereon in photocured micro-channels formed by imprinting and curing a photocurable composition that has a viscosity of less than 5,000 Pascal-seconds at the temperature at which the micro-channels are formed, which conductive micro-wires have an average width of less than or equal to 4 μm and an average depth to average width ratio greater than 1, and each of at least 50% of the conductive micro-wires has a sheet resistance of less than 0.025 ohm/sq.

16. The device of embodiment 15 wherein the pattern of conductive micro-wires comprises silver that has been electrolessly plated with copper, nickel, gold, platinum, or palladium.

17. The device of embodiment 15 or 16, wherein the resulting conductive micro-wires independently have an average width of at least 0.5 μm and up to and including 4 μm.

18. The device of any of embodiments 15 to 17, wherein the pattern of conductive micro-wires is connected to at least one electrical contact.

The following Examples are provided to illustrate the practice of this invention and are not meant to be limiting in any manner.

Example 1

A poly(ethylene terephthalate) film having a dry thickness of about 125 μm that had been surface coated with a poly(vinylidene chloride) containing latex to form an adhesion promotion subbing layer was used as a substrate. The coating formulation shown below in TABLE I was applied as photocurable compositions over the adhesion promotion subbing layer and dried to form photocurable layers for each precursor article, each photocurable layer having a dry thickness of about 5.5 μm.

TABLE I

| Material | Weight % |
| --- | --- |
| Epon SU-8 (Momentive Performance Materials) | 34 |
| Coatosil MP-200 | 6 |
| Triarylsulfonium hexafluorophosphate mixed salts (50% in propylene carbonate) photoinitiator | 4.8 |
| Methyl ethyl ketone (MEK) | 55.2 |

The viscosity and elastic modulus of each photocurable composition was measured without the presence of a photoinitiator for easy handling. The viscosity was about 65 Pascal-seconds at 60° C. and 3333 Pascal-seconds at 40° C., and the elastic modulus was about 3 Pascals at 60° C. and 1111 Pascals at 40° C. The viscosity of the photocurable composition at other temperatures can be calculated assuming that the temperature dependence follows Arrhenius behavior.

Figure 6:
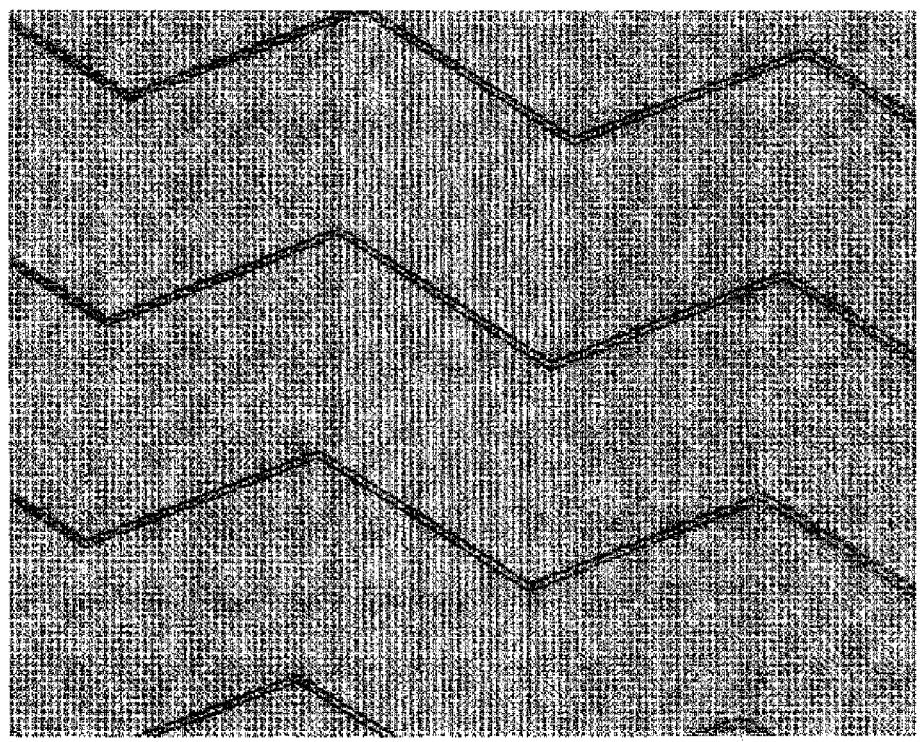
FIG. 6 is an image of a photocured mold surface as described in Invention Example 1 below.

The dry photocurable layer of each resulting precursor article was pressed against a transparent elastomeric mold made from Dow Corning Sylgard 184 siloxane elastomer at various temperatures for about 3 minutes at 5 psi (0.034 MPa) and 2 minutes at 25 psi (0.17 MPa) followed by exposure to ultraviolet light to cure the dry photocurable layer in each article. As shown in FIG. 6, the resulting impressed mold surface exhibited parallel zigzag lines separated at a distance of 100 μm. Each line had an average width of 2.3 μm and an average height of 4 μm. The mold surface with the zigzag line patterns was pressed against each dry photocurable layer for each article that was evaluated.

After the UV light exposure, the elastomeric mold was separated from each article to leave imprints (micro-channels) in the photocurable layer having the aforementioned photocured line patterns except that the line patterns were now made of photocured micro-channels having an average width of about 2.3 μm and an average depth of about 4 μm.

The resulting articles containing photocured micro-channels were filled with an aqueous conductive composition (ink) comprising about 75 weight % of silver nano-particles having a mean nano-particle size of about 73 nm, 0.75 weight % of poly(vinylidene chloride-co-ethyl acrylate-co-acrylic acid) (85/14/1) latex, and 0.34 weight % of a carbon black dispersion having a mean carbon black particle size of about 120 nm. The silver nano-particles were prepared in accordance with the method described in copending and commonly assigned U.S. Ser. No. 13/757,891 (noted above). Excess conductive composition was removed outside the photocured micro-channels using a wiper blade and wiping in such a fashion that most of the excess conductive composition was removed without disturbing the conductive composition in the micro-channels. Filling the photocured micro-channels with more conductive composition and wiping off excess were repeated a couple of times before the filled micro-channels were dried at 80° C. for 1 minute, polished with a wet cloth, treated with saturated hydrochloric acid vapor at room temperature for 2 minutes, and cured further at 90° C. for 2 minutes.

Figure 7A:
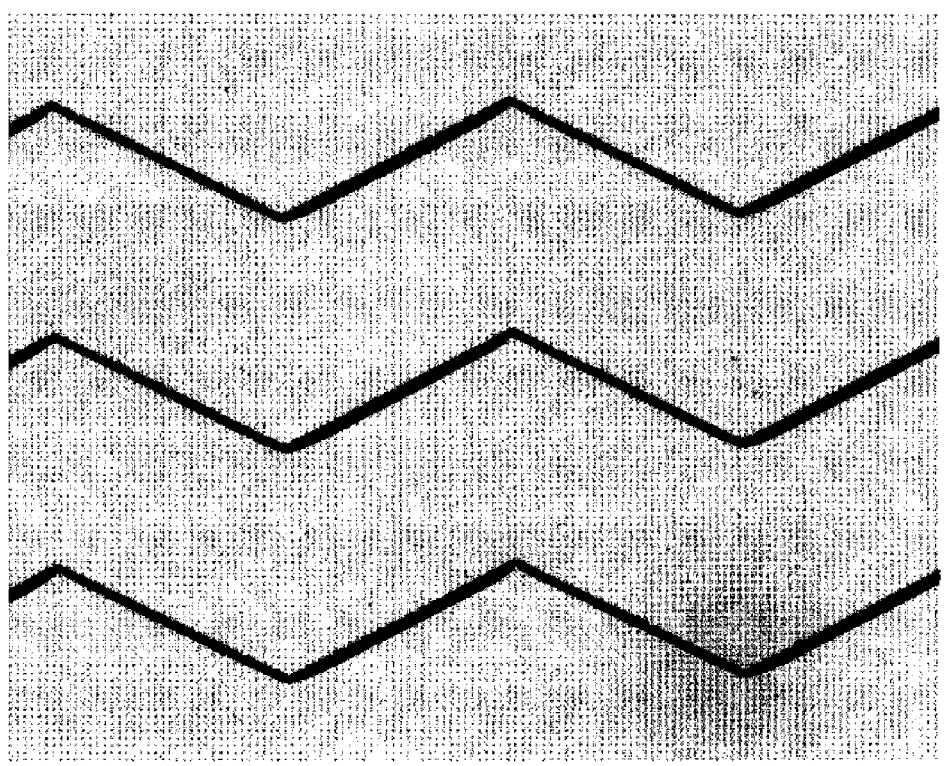
FIGS. 7a and 7b are images of conductive lines in conductive articles obtained at two different temperatures as described in below Example 1.
Figure 7B:
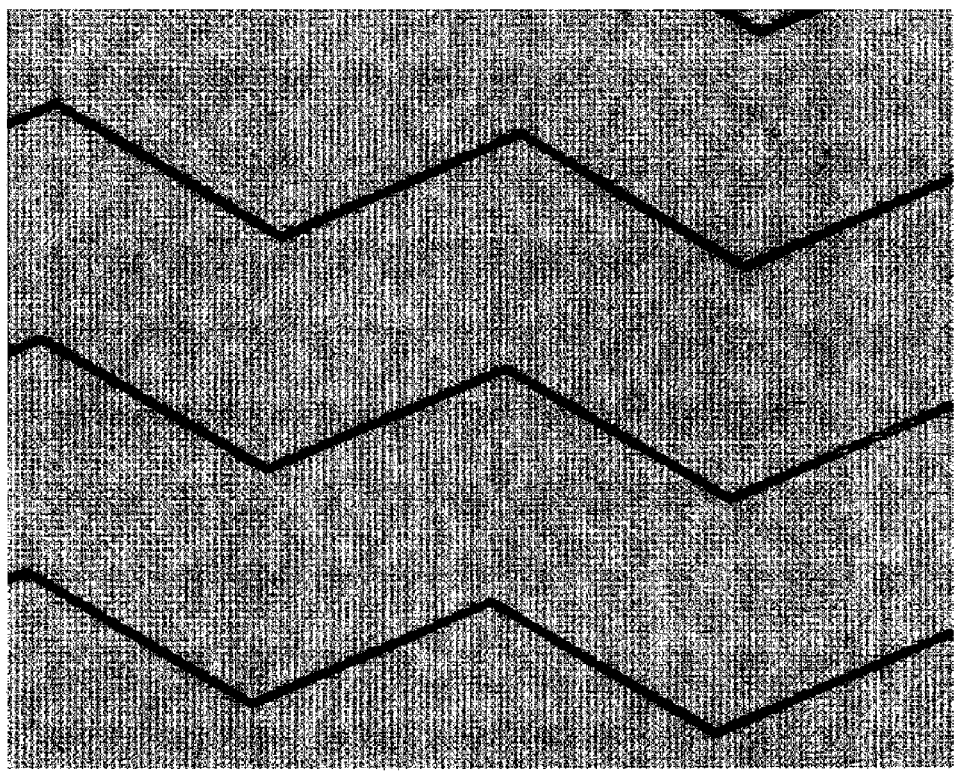
Figure 8:
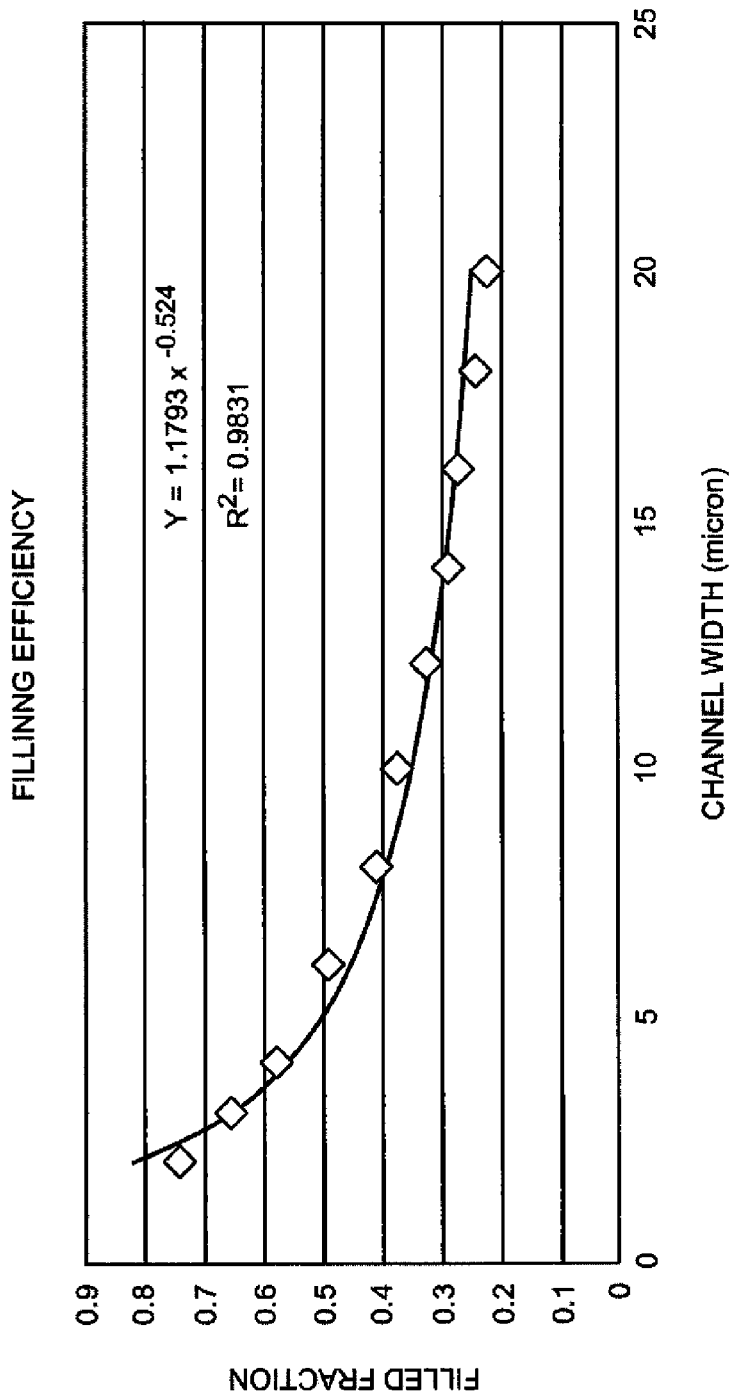
FIG. 8 is a graphical plot of the filling efficiency as measured by the filled volume fraction of the imprinted micro-channels as a function of channel width (in micrometers or microns) as described below in Example 2.

The resulting conductive articles were examined under an optical microscope to evaluate the resulting pattern of conductive micro-wires. FIG. 7a shows conductive micro-wires that were badly folded or twisted while FIG. 7b shows conductive micro-wires that had a very uniform appearance and showed very little shape distortion. TABLE II below shows the results for the conductive micro-wires formed using various micro-channels imprinted at various temperatures together with the viscosity value of photocurable composition prior to UV curing.

TABLE II

| Micro-channel Imprint Temperature (° C.) | Viscosity (Pascal-seconds) | Conductive Micro-wire Pattern Evaluation |
| --- | --- | --- |
| 30 | 29,001 | Badly folded or twisted micro-wires |
| 35 | 9,660 | Lightly folded or twisted micro-wires |
| 44 | 1,457 | Uniform micro-wires |
| 53.7 | 213 | Uniform micro-wires |
| 61 | 111 | Uniform micro-wires |
| 70 | 22.1 | Uniform micro-wires |

The data in Table clearly demonstrate the criticality of the viscosity of the photocurable composition prior to curing at the temperature used for formation of the photocured micro-channels. It is possible to reduce the photocurable composition viscosity by increasing curing temperature. However, when flexible transparent substrates are used, there is a maximum temperature above which such materials start to experience significant dimensional change or distortion. The maximum curing temperature will decrease with increasing pressure and with time since most flexible substrate materials are polymeric and are viscoelastic in nature.

Example 2

A photocurable composition having a 85/15 weight ratio of Epon SU-8 to Coatosil MP-200 was used to form a dry photocurable layer having a dry thickness of about 7 μm over a transparent poly(ethylene terephthalate) film substrate. The dry photocurable layer was then pressed against a transparent elastomeric mold made from Dow Corning Sylgard 184 siloxane elastomer at 70° C. for about 3 minutes at 5 psi (0.034 MPa) and 2 minutes at 25 psi (0.17 MPa) followed by exposure to ultraviolet light to cure the dry photocurable layer to form a pattern of photocured micro-channels. The transparent elastomeric mold had a test structure containing separate lines at various widths from 2 to 20 µm and each line having an average height of about 4 µm and a length of about 10 mm.

After the UV light exposure, the elastomeric mold was separated from the dry photocured layer having micro-channels exhibiting the testing structure described above except that the testing structure had separate micro-channels at various widths from 2 to 20 µm and each line had a length of about 10 mm and a depth of about 4 µm.

The resulting photocured layer with micro-channels was then filled with an aqueous conductive composition (ink) comprising about 75 weight % of silver nano-particles having a mean nano-particle size of about 73 nm, 0.75 weight % of poly(vinylidene chloride-co-ethyl acrylate-co-acrylic acid) (85/14/1) latex, and 0.34 weight % of a carbon black dispersion having a mean carbon black particle size of about 120 nm. The silver nano-particles were prepared in accordance with the method described in copending and commonly assigned U.S. Ser. No. 13/757,891 (noted above). Excess conductive composition outside the photocured micro-channels was removed using a wiper and wiping was conducted in such a fashion that most of the excess conductive composition outside the photocured micro-channels was removed without disturbing the conductive composition in the micro-channels. The process of filling the micro-photocured channels and wiping to remove excess conductive composition was repeated a couple of times before the conductive composition in the photocured micro-channels was dried at 80° C. for 1 minute, polished with a wet cloth, treated with saturated hydrochloric acid vapor at room temperature for 2 minutes, and cured further at 90° C. for 2 minutes.

The electrical resistance of each resulting conductive micro-wire pattern was measured, from which the sheet resistance of conductive micro-wires could be calculated. The measurements were done on 6 different samples and the average sheet resistance was computed for conductive micro-wires having different widths. The results are shown in TABLE III below.

The adhesion of the conductive micro-wires to the photocured micro-channels was measured by a peeling test using a commercial brand transparent adhesive tape (for example Scotch® brand adhesive tape). The electrical resistance was measured again after this adhesion test. The adhesion test results were rated as "excellent", "good", or "poor" with an "excellent" rating meaning that there was very little change in the electrical resistance after the adhesion test; a "good" rating means that there was very little change in the electrical resistance after the adhesion test most of the times, and a "poor" rating means that there was a significant increase in the electrical resistance after the adhesion test. The results are shown below in TABLE III.

TABLE III

| Conductive Micro-wire Width (µm) | Conductive Micro-wire Average Sheet Resistivity (Ω/sq) | Adhesion |
| --- | --- | --- |
| 2 | 0.016 | Excellent |
| 3 | 0.019 | Excellent |
| 4 | 0.021 | Good |
| 6 | 0.025 | Poor |
| 8 | 0.030 | Poor |
| 10 | 0.033 | Poor |
| 12 | 0.037 | Poor |
| 14 | 0.042 | Poor |
| 16 | 0.045 | Poor |

TABLE III-continued

| Conductive Micro-wire Width (µm) | Conductive Micro-wire Average Sheet Resistivity (Ω/sq) | Adhesion |
| --- | --- | --- |
| 18 | 0.050 | Poor |
| 20 | 0.053 | Poor |

The average thickness (height) of the conductive micro-wire that had an average width of about 2 µm was measured by SEM (scanning electron microscope) on each sample cross-section and was found to be about 3 µm, from which the volume resistivity of the conductive micro-wire was calculated to have a value of about $4.91 \times 10^{-6}$ Ω/cm, which is about 3 times greater than the volume resistivity of bulk silver.

Assuming that all the conductive micro-wires had the same bulk resistivity, the average thickness (height) of each conductive micro-wire could be calculated. The ratio of the average thickness of the conductive micro-wire to the average depth of the photocured micro-channel was computed and used as a measure of the filling efficiency of the conductive composition as a function of photocured micro-channel width. The result is shown in FIG. 6, which shows that the filling efficiency was less than 50% for the micro-channels having an average width greater than 4 µm.

In addition to the poor adhesion observed for conductive micro-wires having an average width greater than 4 µm, the low filling efficiency for those photocured micro-channels is a disadvantage for providing highly transparent conductive patterns of flexible substrates to be used as conductive electrodes. To make transparent flexible conductive electrodes having conductive micro-wires having a sheet resistance of about, for example, 1.76 Ω/sq, the fraction of the overall surface area filled by the conductive composition was about 1.85%, 2.33%, and 2.83%, respectively, for the conductive micro-wires having an average width of about 2 µm, 4 µm, and 6 µm based on the data provided in TABLE III. The higher the fraction of the overall surface area filled by the conductive composition, the lower the transparency of the transparent conductive article.

The invention has been described in detail with particular reference to certain preferred embodiments thereof, but it will be understood that variations and modifications can be effected within the spirit and scope of the invention.

PARTS LIST 5 micro-wire structure
10 substrate
20 photocured layer
30 photocured micro-channels
40 conductive composition (ink)
50 micro-wired
80 mold
90 radiation source
92 heat
100 provide substrate step
105 coat layer step
110 imprint micro-channels step
115 cure micro-channels step
120 coat conductive ink step
125 remove conductive ink step
130 dry conductive ink step

The invention claimed is:

1. A device comprising a conductive article, the conductive article comprising a transparent flexible substrate and a pattern of conductive micro-wires disposed thereon in photocured micro-channels that have been formed by imprinting and curing a photocurable composition that has a viscosity of less than 5,000 Pascal-seconds at the temperature at which the micro-channels are formed, which conductive micro-wires have an average width of less than or equal to 4 μm and an average depth to average width ratio greater than 1, and each of at least 50% of the conductive micro-wires has a sheet resistance of less than 0.025 ohm/sq.

2. The device of claim 1, wherein the pattern of conductive micro-wires comprises at least one of silver, palladium, platinum, copper, and indium-tin oxide.

3. The device of claim 2 wherein the pattern of conductive micro-wires comprises silver that has been electrolessly plated with copper, nickel, gold, platinum, or palladium.

4. The device of claim 1, wherein the photocured micro-channels and resulting conductive micro-wires have an average width of at least 0.5 μm and up to and including 4 μm.

5. The device of claim 1, wherein the photocured micro-channels have been formed from a photocurable composition comprising: a compound that generates an acid upon exposure to radiation of at least 190 nm and up to and including 500 nm, a multifunctional epoxy compound having an epoxy equivalent molecular weight of less than 1,000, and an epoxysilane oligomer that is represented by the following Structure (I):

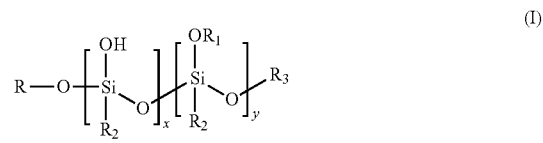

(I)

wherein R and $R_1$ are independently substituted or unsubstituted alkyl groups, $R_2$ is a substituted or unsubstituted linear, branched, or cyclic alkyl group or an alkyl ether residue substituted with an epoxide, $R_3$ is hydrogen or a substituted or unsubstituted alkyl, and $x+y \geq 2$.

6. The device of claim 1, wherein the pattern of conductive micro-wires is connected to at least one electrical contact.

7. The device of claim 1, wherein the conductive article exhibits a haze of less than 10% and a light transmission of at least 80%.

8. The device of claim 1, wherein the conductive article exhibits a haze of less than 5% and a light transmission of at least 85%.

9. The device of claim 1, wherein the pattern of conductive micro-wires comprises at least silver, the average width of the micro-wires is at least 0.5 μm and less than or equal to 4 μm and the average depth to average width ratio is greater than 0.5 and up to and including 3.

* * * * *